(12) United States Patent
Lee (10) Patent No.: US 12,324,167 B2
(45) Date of Patent: Jun. 3, 2025

(54) SEMICONDUCTOR DEVICES PERFORMING THRESHOLD SWITCHING

(71) Applicant: SK hynix Inc., Icheon-si (KR)

(72) Inventor: Woo Cheol Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 496 days.

(21) Appl. No.: 17/875,400

(22) Filed: Jul. 27, 2022

(65) Prior Publication Data
US 2023/0292532 A1    Sep. 14, 2023

(30) Foreign Application Priority Data

Mar. 14, 2022   (KR) ........................ 10-2022-0031718

(51) Int. Cl.
*H10B 63/00*   (2023.01)
*H10N 70/00*   (2023.01)
*H10N 70/20*   (2023.01)

(52) U.S. Cl.
CPC ............. *H10B 63/34* (2023.02); *H10B 63/84* (2023.02); *H10N 70/253* (2023.02); *H10N 70/8833* (2023.02)

(58) Field of Classification Search
None
See application file for complete search history.

(56) References Cited

U.S. PATENT DOCUMENTS

| | | | |
|---|---|---|---|
| 10,497,866 B1 * | 12/2019 | Fuller | H10B 63/24 |
| 2008/0285325 A1 | 11/2008 | Kameshiro et al. | |
| 2013/0248980 A1 | 9/2013 | Han et al. | |
| 2015/0028278 A1 * | 1/2015 | Lee | H10B 41/30 |
| | | | 257/2 |
| 2019/0305045 A1 * | 10/2019 | Sharma | H10N 50/01 |
| 2020/0273962 A1 | 8/2020 | Pillarisetty et al. | |
| 2023/0345740 A1 * | 10/2023 | Ho | H10B 63/84 |

\* cited by examiner

*Primary Examiner* — Khaja Ahmad (57) ABSTRACT

A semiconductor device according to an embodiment of the present disclosure includes a substrate, a gate electrode layer disposed over the substrate, a gate dielectric layer disposed on the gate electrode layer, a channel electrode layer disposed on the gate dielectric layer, a threshold switching layer disposed on the channel electrode layer, and a source electrode layer and a drain electrode layer that are disposed on the threshold switching layer to be spaced apart from each other.

20 Claims, 9 Drawing Sheets

SEMICONDUCTOR DEVICES PERFORMING THRESHOLD SWITCHING

CROSS-REFERENCE TO RELATED APPLICATIONS

The present application claims priority under 35 U.S.C. § 119(a) to Korean Application No. 10-2022-0031718, filed on Mar. 14, 2022 in the Korean Intellectual Property Office, which is incorporated herein by reference in its entirety.

BACKGROUND

1. Technical Field

The present disclosure generally relates to semiconductor devices performing threshold switching.

2. Related Art

In general, a transistor that is a switching device is an example of a semiconductor device that performs threshold switching. In recent years, as the size of the transistor continues to decrease, the operating voltage of the transistor also decreases. However, even at a low operating voltage, the transistor needs to maintain a sufficiently high on-off ratio between output signals.

Accordingly, in order to implement a high on-off ratio of the output signals, recently active research has been conducted on a switching device having a new structure that is different from the structure of the conventional metal-oxide semiconductor field effect transistor (MOSFET).

SUMMARY

A semiconductor device according to an embodiment of the present disclosure may include a substrate, a gate electrode layer disposed over the substrate, a gate dielectric layer disposed on the gate electrode layer, a channel electrode layer disposed on the gate dielectric layer, a threshold switching layer disposed on the channel electrode layer, and a source electrode layer and a drain electrode layer that are disposed on the threshold switching layer to be spaced apart from each other.

A semiconductor device according to another embodiment of the present disclosure may include a substrate, a channel electrode layer disposed over the substrate, a threshold switching layer disposed on a first surface of the channel electrode layer, a source electrode layer and a drain electrode layer that are disposed on the threshold switching layer to be spaced apart from each other, a gate dielectric layer disposed on a second surface of the channel electrode layer opposite to the first surface of the channel electrode layer, and a gate electrode layer disposed on the gate dielectric layer.

A semiconductor device according to further another embodiment of the present disclosure may include a substrate, a source electrode layer and a drain electrode layer that are disposed over the substrate to be spaced apart from each other in a direction perpendicular to a surface of the substrate, a threshold switching layer disposed over the substrate to contact the source electrode layer and the drain electrode layer, a channel electrode layer disposed over the substrate to contact the threshold switching layer, a gate dielectric layer disposed on the channel electrode layer, and a gate electrode layer disposed on the gate dielectric layer.

DETAILED DESCRIPTION

Hereinafter, embodiments of the present disclosure will be described in detail with reference to the accompanying drawings. In the drawings, in order to clearly express the components of each device, the sizes of the components, such as width and thickness of the components, are enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, but not used to preclude the presence or possibility of addition one or more other features, numbers, steps, operations, components, elements, parts, or combinations thereof.

Figure 1:
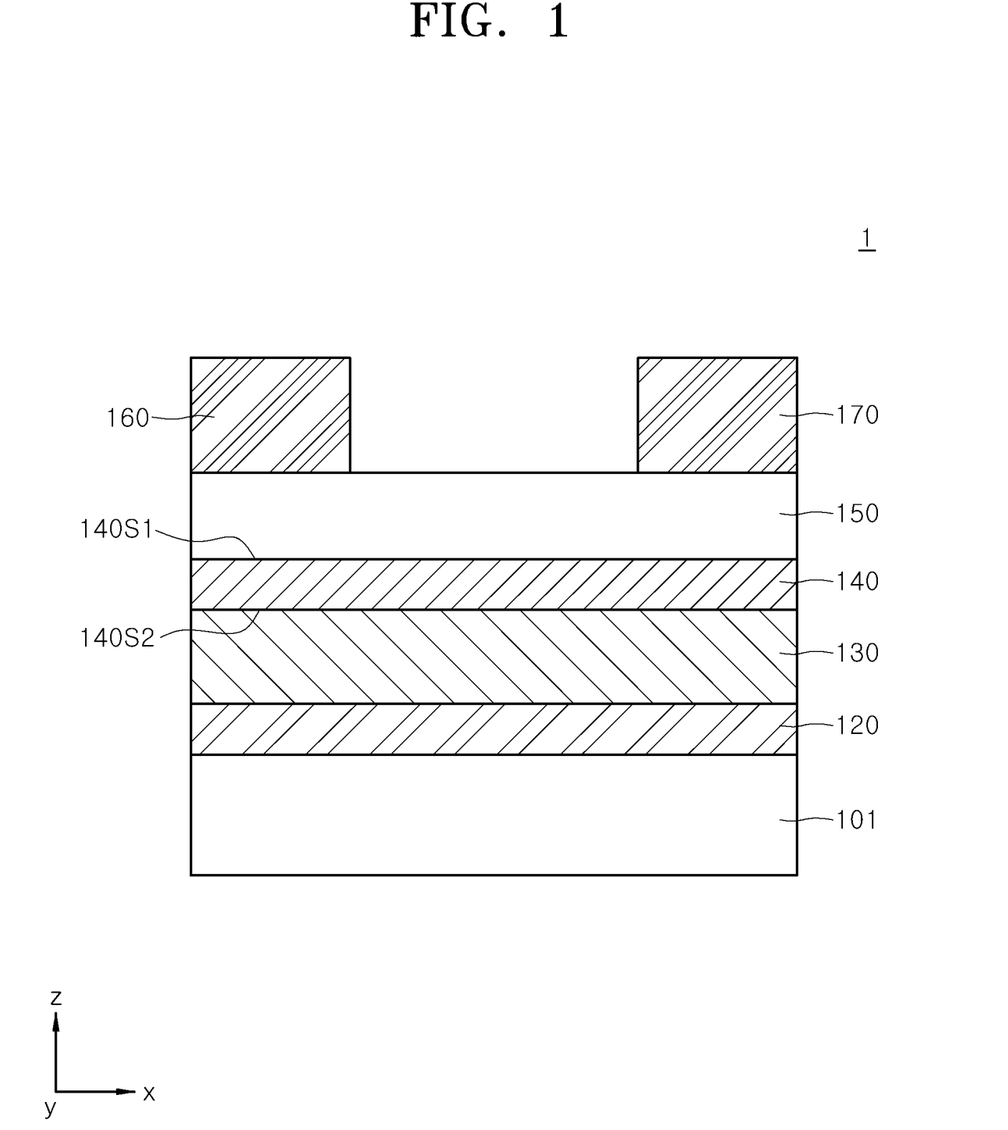
FIG. 1 is a cross-sectional view schematically illustrating a semiconductor device according to an embodiment of the present disclosure.
Figure 2:
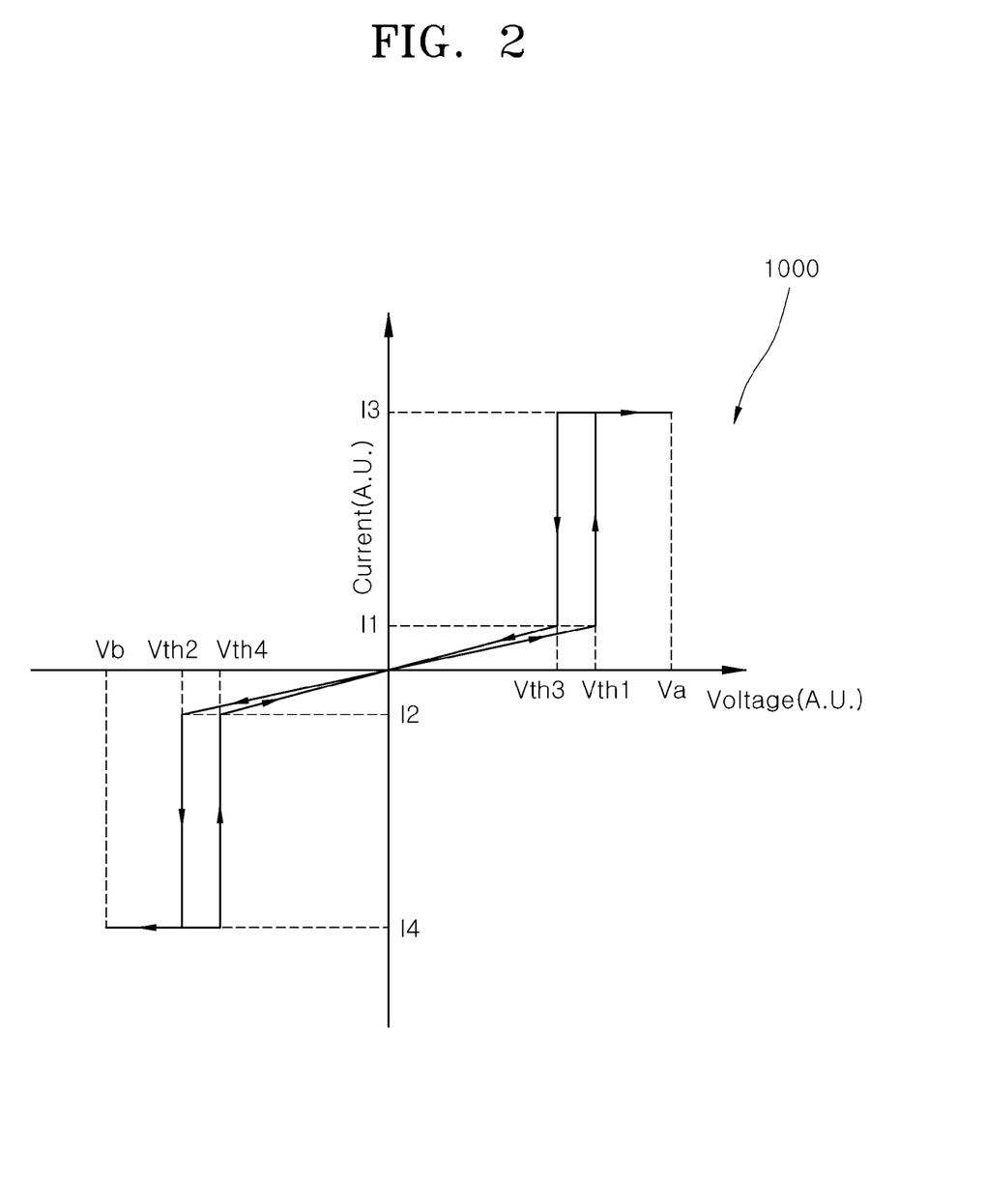
FIG. 2 is a graph schematically illustrating an electrical property of a threshold switching layer according to an embodiment of the present disclosure.

FIG. 1 is a cross-sectional view schematically illustrating a semiconductor device according to an embodiment of the present disclosure. FIG. 2 is a graph schematically illustrating an electrical property of a threshold switching layer according to an embodiment of the present disclosure.

Referring to FIG. 1, a semiconductor device 1 may include a substrate 101, a gate electrode layer 120, a gate dielectric layer 130, a channel electrode layer 140, a threshold switching layer 150, a source electrode layer 160, and a drain electrode layer 170. The semiconductor device 1 may be a switching device that performs a threshold switching operation. The semiconductor device 1 may maintain a turned-off state when a gate voltage less than a predetermined threshold voltage is applied, and may be turned-on when a gate voltage equal to or greater than the predetermined threshold voltage is applied. In FIG. 1, conductive carriers may be conducted between the source electrode layer 160 and the drain electrode layer 170.

The substrate 101 may include a material capable of being processed through semiconductor integration processes. As an example, the substrate 101 may include a semiconductor material. Specifically, the semiconductor material may include silicon (Si), germanium (Ge), gallium arsenide (GaAs), molybdenum sulfide ($MoS_2$), molybdenum selenide ($MoSe_2$), hafnium selenide ($HfSe_2$), indium selenide (InSe), gallium selenide (GaSe), black phosphorus, indium-gallium-zinc oxide (IGZO), or a combination of two or more thereof. As another example, the substrate 101 may include an insulating material. The insulating material may include oxide, nitride, oxynitride, or a combination of two or more thereof.

The gate electrode layer 120 may be disposed on the substrate 101. The gate electrode layer 120 may include a conductive material. The conductive material may include, for example, doped semiconductor, metal, conductive metal nitride, conductive metal carbide, conductive metal silicide, or conductive metal oxide. The conductive material may include, for example, n-type or p-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. Although not shown in FIG. 1, in some embodiments, an insulation layer may be disposed between the substrate 101 and the gate electrode layer 120. The insulation layer may electrically insulate the substrate 101 and the gate electrode layer 120 from each other.

The gate dielectric layer 130 may be disposed on the gate electrode layer 120. The gate dielectric layer 130 may include a dielectric material. The dielectric material may include, for example, silicon oxide, silicon nitride, silicon oxynitride, aluminum oxide, hafnium oxide, zirconium oxide, hafnium zirconium oxide, or a combination of two or more thereof.

The channel electrode layer 140 may be disposed on the gate dielectric layer 130. The channel electrode layer 140 may be electrically separated from the gate electrode layer 120. The channel electrode layer 140 may include a conductor. The conductor may include metal, for example. In an embodiment, the channel electrode layer 140 may include a noble metal. The channel electrode layer 140 may include, for example, gold (Au), platinum (Pt), silver (Ag), ruthenium (Ru), iridium (Ir), palladium (Pd), or a combination of two or more thereof.

The channel electrode layer 140 may include a conductor having high electrical conductivity compared to a semiconductor material. Accordingly, the electrical conductivity of conductive carriers conducting through the channel electrode layer 140 may be improved. The conductive carriers may include, for example, electrons or holes.

The threshold switching layer 150 may be disposed on the channel electrode layer 140. The threshold switching layer 150 may include a resistance change material. The resistance change material may refer to a material whose electrical resistance state is reversibly changed between a high resistance state and a low resistance state by an externally applied voltage.

The resistance change material of the threshold switching layer 150 may have a non-memory property (i.e., electrically volatile property) with respect to the change in the electrical resistance state. For example, when no voltage is applied to the resistance change material or when a voltage less than a predetermined first threshold voltage is applied to the resistance change material, the electrical resistance state of the resistance change material may have a high resistance state. When a voltage equal to or greater than the predetermined first threshold voltage is applied to the resistance change material, the electrical resistance state of the resistance change material may change from the high resistance state to a low resistance state. From the low resistance state, when the applied voltage is removed or the applied voltage is reduced below a predetermined second threshold voltage, the electrical resistance state of the resistance change material may change back to the high resistance state. The resistance change material might not store the resistance state changed by the application of the voltage after the applied voltage is removed.

The resistance change material may include, for example, silicon oxide, aluminum oxide, zirconium oxide, hafnium oxide, tungsten oxide, titanium oxide, nickel oxide, copper oxide, manganese oxide, tantalum oxide, niobium oxide, iron oxide, or a combination of two or more thereof. The resistance change material may include at least one selected from, for example, silver (Ag), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf) as a dopant. In an embodiment, the threshold switching layer 150 may include zirconium oxide doped with silver (Ag).

The threshold switching layer 150 may perform a threshold switching operation. FIG. 2 is a graph schematically illustrating currents output from the threshold switching layer 150 when applying voltages in positive and negative directions to opposite ends of the threshold switching layer 150 and sequentially increasing the magnitudes of the voltages.

Referring to FIG. 2, when voltages less than first and second threshold voltages Vth1 and Vth2 are respectively applied to the opposite ends of the threshold switching layer 150 in a positive direction and a negative direction, a low current corresponding to a leakage current level may be output. When the applied voltages reach the first and second threshold voltages Vth1 and Vth2, respectively, the output currents may rapidly increase from first and second output currents I1 and I2 to third and fourth output currents I3 and I4, respectively. As an example, the third and fourth output currents I3 and I4 may be at least 10,000 times greater than the first and second output currents I1 and I2, respectively. In addition, in the first and second threshold voltages Vth1 and Vth2, the ratio of the current increase according to the voltage increase, that is, the slope of the graph 1000 of the output current may be substantially vertical. As an example, the differential value of the graph 1000 of the output current at the first and second threshold voltages Vth1 and Vth2 may be substantially infinite. Meanwhile, after the output currents sharply increase at the first and second threshold voltages Vth1 and Vth2, the output currents may be substantially saturated at the first and second saturation voltages Va and Vb.

Subsequently, the applied voltages may sequentially decrease from the first and second voltages Va and Vb. When the applied voltages reach third and fourth threshold voltages Vth3 and Vth4, respectively, the output currents may rapidly decrease. When the applied voltages are less than the third and fourth threshold voltages Vth3 and Vth4, the threshold switching layer 150 may output a low level of current corresponding to leakage current in proportion to the magnitudes of the applied voltages.

Although FIG. 2 illustrates a first threshold voltage Vth1 that is greater than a third threshold voltage Vth3, and a second threshold voltage Vth2 that is greater than a fourth threshold voltage Vth4, the scope and spirit of the present disclosure are not necessarily limited thereto. In some embodiments, the magnitude of the first threshold voltage Vth1 may be substantially the same as the magnitude of the third threshold voltage Vth3, and the magnitude of the second threshold voltage Vth2 may be substantially the same as the magnitude of the fourth threshold voltage Vth4.

As described above, with respect to the threshold voltages Vth1, Vth2, Vth3, and Vth4 as boundary examples, the electrical resistance state of the threshold switching layer 150 may be switched depending on the magnitude of the applied voltage. In addition, when the applied voltage is completely removed from the threshold switching layer 150, the electrical resistance state of the threshold switching layer 150 may maintain a high resistance state.

Referring back to FIG. 1, the source electrode layer 160 and the drain electrode layer 170 may be disposed on the threshold switching layer 150. The source electrode layer 160 and the drain electrode layer 170 may be disposed on substantially the same plane. Each of the source electrode layer 160 and the drain electrode layer 170 may be electrically separated from the channel electrode layer 140.

In an embodiment, at least a portion of the source electrode layer 160 and at least a portion of the channel electrode layer 140 may overlap with each other in a direction (i.e., z-direction) that is substantially perpendicular to a first surface 140S1 of the channel electrode layer 140. In addition, at least a portion of the drain electrode layer 170 and at least a portion of the channel electrode layer 140 may overlap with each other in the z-direction. As a result, and as will be described later with reference to FIGS. 4 and 5, first and second conductive paths 151 and 152 may be formed inside the threshold switching layer 150. The first and second conductive paths 151 and 152 may be positioned between the source electrode layer 160 and the channel electrode layer 140, and between the drain electrode layer 170 and the channel electrode layer 140.

Each of the source electrode layer 160 and the drain electrode layer 170 may include a conductive material. The conductive material may include, for example, doped semiconductor, metal, conductive metal nitride, conductive metal carbide, conductive metal silicide, or conductive metal oxide. The conductive material may include, for example, n-type or p-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof.

As described above, the semiconductor device 1 according to an embodiment of the present disclosure may include the substrate 101 and the channel electrode layer 140 disposed over the substrate 101. The threshold switching layer 150 may be disposed on the first surface 140S1 of the channel electrode layer 140, and the source electrode layer 160 and the drain electrode layer 170 may be disposed on the threshold switching layer 150 to be spaced apart from each other in a direction that is substantially perpendicular to the z-direction, (i.e., an x-direction). In addition, the gate dielectric layer 130 may be disposed on a second surface 140S2 of the channel electrode layer 140, opposite to the first surface 140S1. The gate electrode layer 120 may be disposed on the gate dielectric layer 130. As will be described later with reference to FIGS. 4 and 5, the switching operation of the semiconductor device 1 that may be performed depends on the reversible formation of a conductive path in the threshold switching layer 150 that result from voltages applied to the gate electrode layer 120, the source electrode layer 160, and the drain electrode layer 170.

Figure 3:
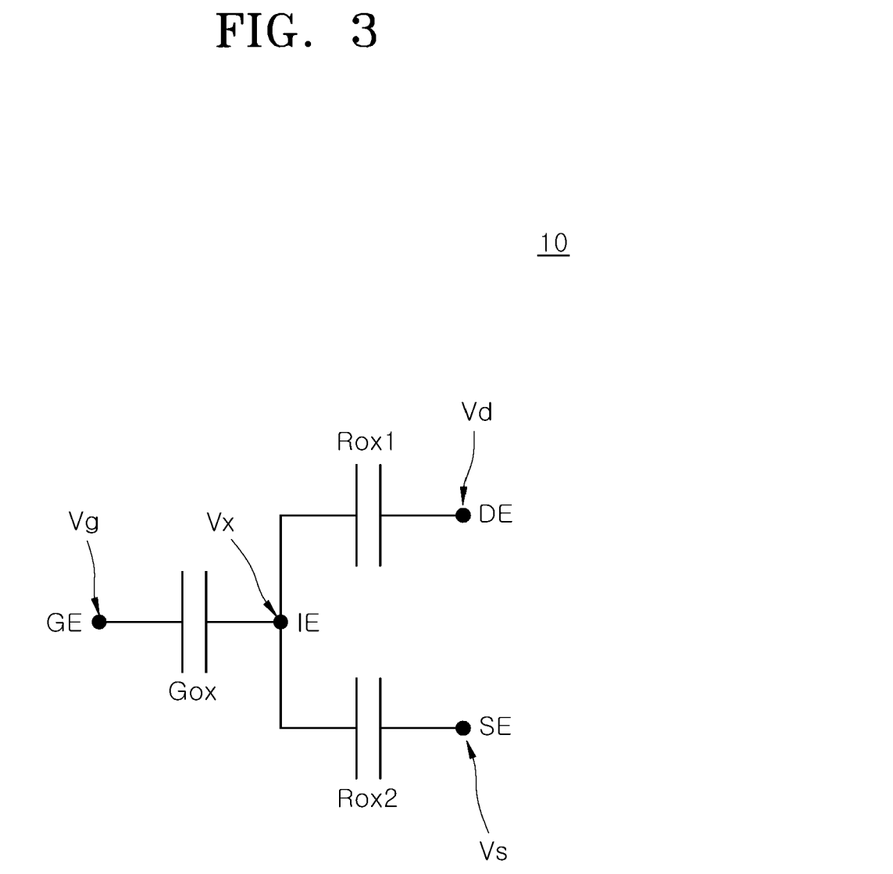
FIG. 3 is a schematic circuit diagram illustrating operations of a semiconductor device according to an embodiment of the present disclosure.
Figure 4:
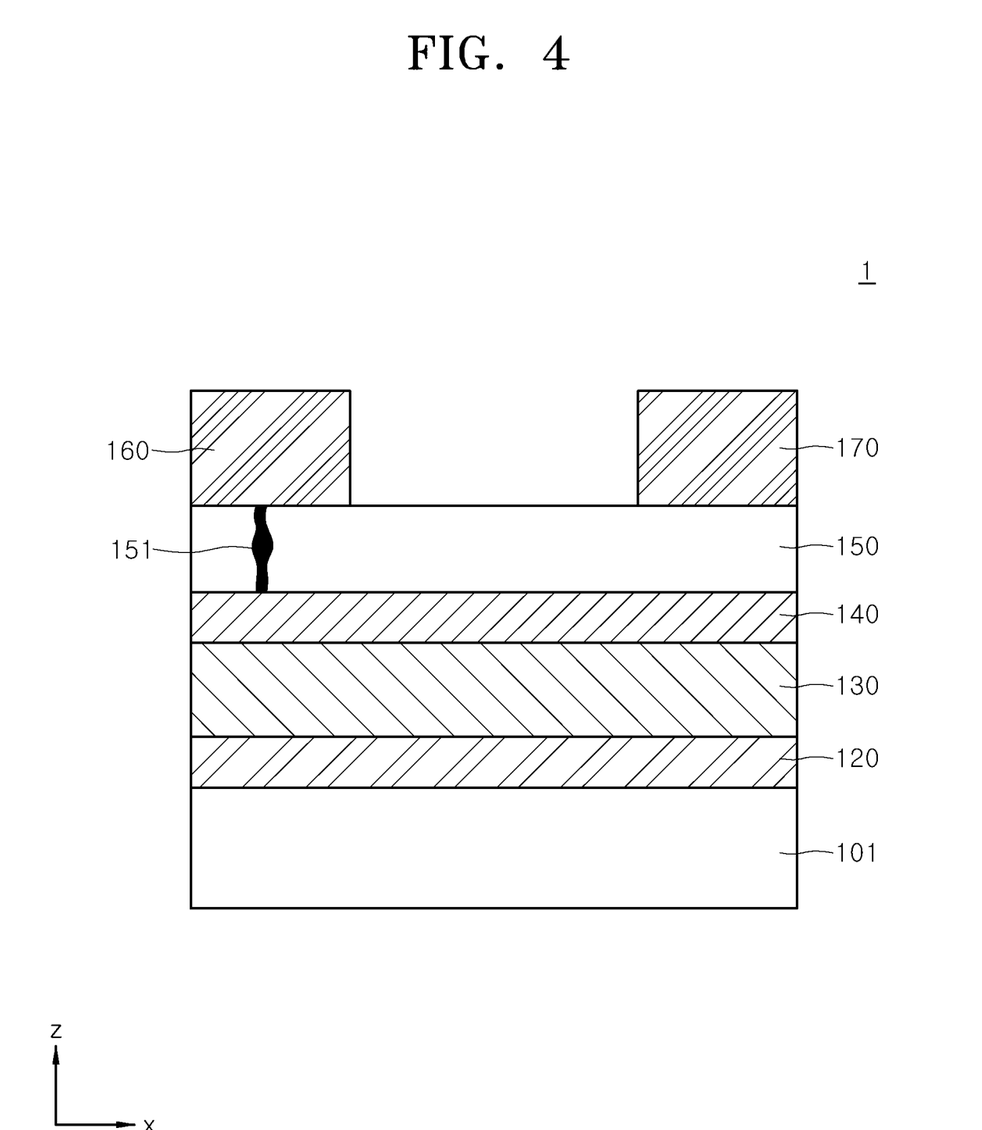
FIGS. 4 and 5 are views schematically illustrating an operation method of a semiconductor device according to an embodiment of the present disclosure.
Figure 5:
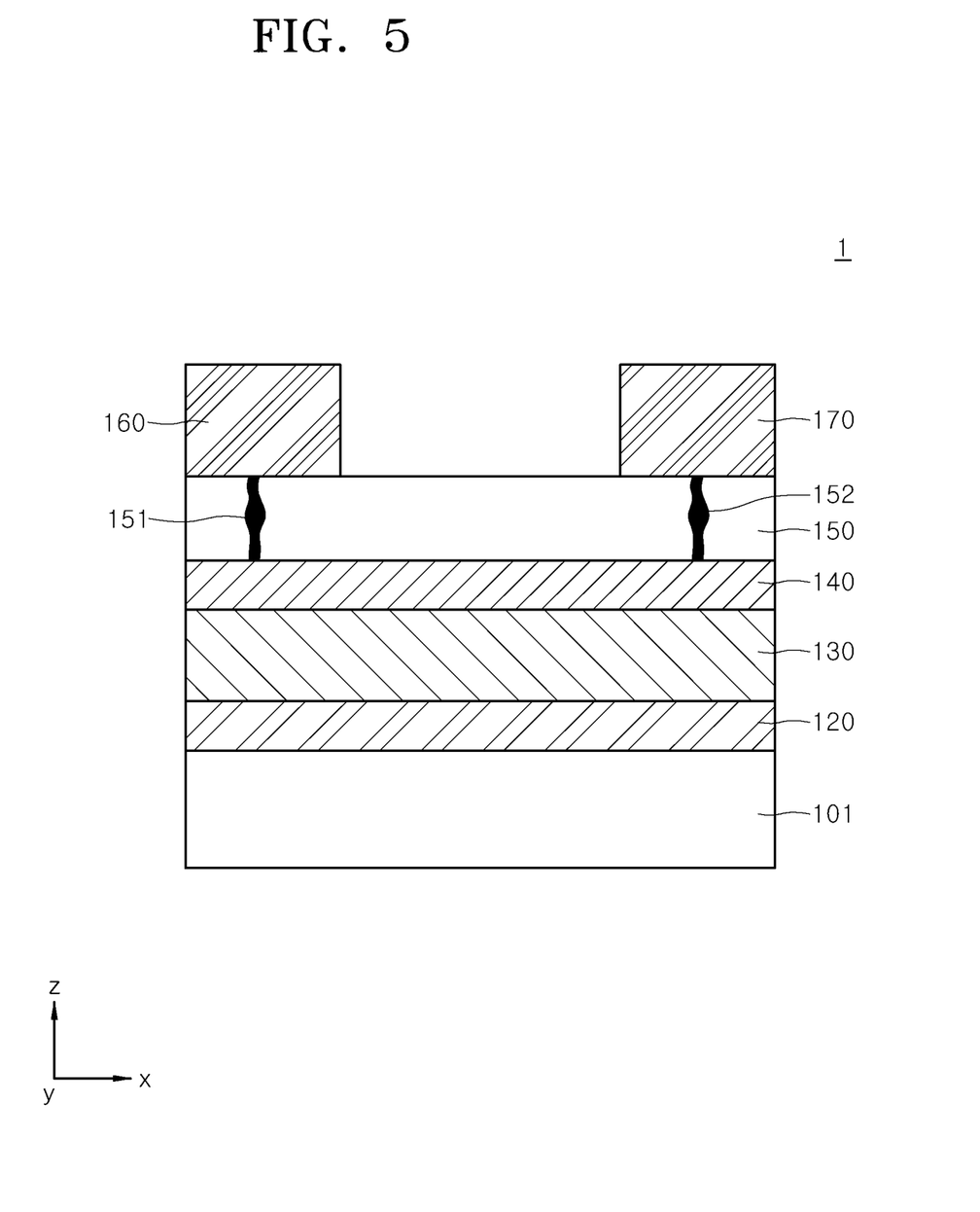

FIG. 3 is a schematic circuit diagram illustrating operations of a semiconductor device 10 according to an embodiment of the present disclosure. FIGS. 4 and 5 are views schematically illustrating an operation method of a semiconductor device according to an embodiment of the present disclosure. An operation method of a semiconductor device 10 of FIGS. 4 and 5 may be described using a semiconductor device 1 of FIG. 1.

Referring to FIGS. 1 and 3, the gate electrode layer 120, the gate dielectric layer 130, the channel electrode layer 140, the threshold switching layer 150, the source electrode layer 160, and the drain electrode layer 170 of the semiconductor device 1 may correspond to a gate electrode GE, a gate dielectric layer Gox, a channel electrode IE, first and second switching dielectric layers Rox1 and Rox2, a source electrode SE, and a drain electrode DE of the semiconductor device 10 of FIG. 3. The first and second switching dielectric layers Rox1 and Rox2 of FIG. 3, which perform the threshold switching operation, may correspond to different portions of the threshold switching layer 150 of FIG. 1. In an embodiment, the threshold voltages of the first and second switching dielectric layers Rox1 and Rox2 for the threshold switching operation may be the same. When no voltage is applied to opposite ends of each of the first and second switching dielectric layers Rox1 and Rox2, the electrical resistance state of the first and second switching dielectric layers Rox1 and Rox2 may be maintained in high resistance states.

Referring to FIG. 3, a source voltage Vs and a drain voltage Vd may be applied to the source electrode SE and the drain electrode DE, respectively. The source voltage Vs and the drain voltage Vd may have different values. In an embodiment, a difference between the source voltage Vs and the drain voltage Vd may be greater than the threshold voltages of the first and second switching dielectric layers Rox1 and Rox2. However, the difference between the source voltage Vs and the drain voltage Vd may be less than twice the threshold voltage of each of the first and second switching dielectric layers Rox1 and Rox2. This is because, when the difference between the source voltage Vs and the drain voltage Vd is greater than twice the threshold voltage of each of the first and second switching dielectric layers Rox1 and Rox2, the first and second switching dielectric layers Rox1 and Rox2 may be switched from the high resistance state to the low resistance state even without application of the gate voltage Vg, and thus, conductive carriers may conduct from the source electrode SE to the drain electrode DE via the channel electrode IE.

When the gate voltage Vg is applied, an electric potential Vx of the channel electrode IE may increase. Accordingly, a voltage corresponding to the difference between the electric potential Vx of the channel electrode IE and the source voltage Vs may be applied to the opposite ends of the first switching dielectric layer Rox1. A voltage corresponding to the difference between the electric potential Vx of the channel electrode IE and the drain voltage Vd may be applied to opposite ends of the second switching dielectric layer Rox2.

As described above, because the threshold voltages of the first and second switching dielectric layers Rox1 and Rox2 are the same, as the electric potential Vx of the channel electrode IE increases, the electrical resistance of one of the first and second switching dielectric layers Rox1 and Rox2 may be switched from a high resistance state to a low resistance state. In an embodiment, when the source voltage Vs is less than the drain voltage Vd, the voltage applied to the opposite ends of the first switching dielectric layer Rox1 may reach the threshold voltage before the voltage applied to the opposite ends of the second switching dielectric layer Rox2. Accordingly, the first switching dielectric layer Rox1 may be switched from the high resistance state to the low resistance state first.

Referring to FIGS. 3 and 4, the operation of switching the electrical resistance state of the first switching dielectric layer Rox1 may be an operation of forming a first conductive path 151 inside the threshold switching layer 150 of the semiconductor device 1 of FIG. 4. The first conductive path 151 connects the source electrode layer 160 and the channel electrode layer 140 to each other. In an embodiment, the first conductive path 151 may include a conductive filament. The conductive filament may be formed by agglomerating metal ions or oxygen vacancies of the oxide that are included in the threshold switching layer 150 and then arranging the metal ions or oxygen vacancies in one direction, resulting in a low resistance state in the first switching dielectric layer Rox1.

Referring to FIG. 3 again, when the electrical resistance state of the first switching dielectric layer Rox1 is changed to the low resistance state, the electric potential of the channel electrode IE may be changed to a value substantially equal to the source voltage Vs. Accordingly, the voltage applied to the opposite ends of the second switching dielectric layer Rox2 may reach a difference between the source voltage Vs and the drain voltage Vd. Because the difference between the source voltage Vs and the drain voltage Vd is greater than the threshold voltage of the second switching dielectric layer Rox2, the electrical resistance state of the second switching dielectric layer Rox2 may be switched from a high resistance state to a low resistance state.

Referring to FIGS. 3 and 5, the operation of switching the electrical resistance state of the second switching dielectric layer Rox2 may be an operation of forming a second conductive path 152 inside the threshold switching layer 150 of the semiconductor device 1 of FIG. 5. The second conductive path 152 connects the drain electrode layer 170 and the channel electrode layer 140 to each other. In an embodiment, the second conductive path 152 may include a conductive filament. The conductive filament may be formed by agglomerating metal ions or oxygen vacancies of the oxide that are included in the threshold switching layer 150 and then arranging the metal ions or oxygen vacancies in one direction, resulting in a low resistance state in the second switching dielectric layer Rox2.

Referring to FIG. 3 again, when the electrical resistance states of the first and second switching dielectric layers Rox1 and Rox2 are switched to the low resistance state, an operating current may flow through the channel electrode IE between the source electrode SE and the drain electrode DE. That is, the semiconductor device 10 may be turned-on. Referring to FIG. 5, the conductive carriers may move from the source electrode layer 160 to the channel electrode layer 140 along the first conductive path 151, and then, may conduct through the channel electrode layer 140. Subsequently, the conductive carriers may move from the channel electrode layer 140 to the drain electrode layer 170 through the second conductive path 152. Alternatively, the conductive carriers may move from the drain electrode layer 170 to the channel electrode layer 140 through the second conductive path 152, and then, may conduct through the channel electrode layer 140. Subsequently, the conductive carriers may move from the channel electrode layer 140 to the source electrode layer 160 through the first conductive path 151.

Referring to FIGS. 1, 4, and 5, in the semiconductor device 1, the channel electrode layer 150 includes a conductor, so the density of the conductive carriers conducting through the channel electrode layer 150 may be improved, as compared to a case in which the channel electrode layer 150 includes a semiconductor material. In addition, as described with reference to FIG. 2, the threshold switching layer 150 may perform a switching operation, in which the output current rapidly increases when the voltage applied to the opposite ends of the layer reaches the threshold voltage. Accordingly, in semiconductor devices according to embodiments of the present disclosure, a swing value equal to or less than the threshold voltage may be improved as compared to a conventional metal-oxide semiconductor field effect transistor.

Meanwhile, referring back to FIG. 3, the voltages applied to the opposite ends of each of the first and second switching dielectric layers Rox1 and Rox2 may be decreased below the threshold voltage. Accordingly, the electrical resistance states of the first and second switching dielectric layers Rox1 and Rox2 may be switched to the high resistance state. Accordingly, the operating current flowing through the channel electrode IE may be blocked to turn-off the semiconductor device 10. That is, the first and second conductive paths 151 and 152 shown in FIG. 5 may be removed or electrically disconnected, and the electrical resistance state of the threshold switching layer 150 may be switched to the high resistance state. Accordingly, the conduction of the conductive carriers through the channel electrode layer 140 may be blocked or inhibited.

In order to turn-off the semiconductor device 10, in the circuit diagram of FIG. 3, the electric potential Vx of the channel electrode IE may be decreased by decreasing the gate voltage Vg. As the electric potential Vx of the channel electrode IE is decreased, the difference between the electric potential Vx of the channel electrode IE and the drain voltage Vd and the difference between the electric potential Vx of the channel electrode IE and the source voltage Vs may be decreased to the threshold voltage or below. In addition, in some embodiments, in order to switch the electrical resistance states of the first and second switching dielectric layers Rox1 and Rox2 to the high resistance states, the gate voltage Vg, the source voltage Vs, and the drain voltage Vd may be controlled together. As an example, a semiconductor device 1 may be turned-off by removing the applied gate voltage Vg, the source voltage Vs, and the drain voltage Vd.

Figure 6:
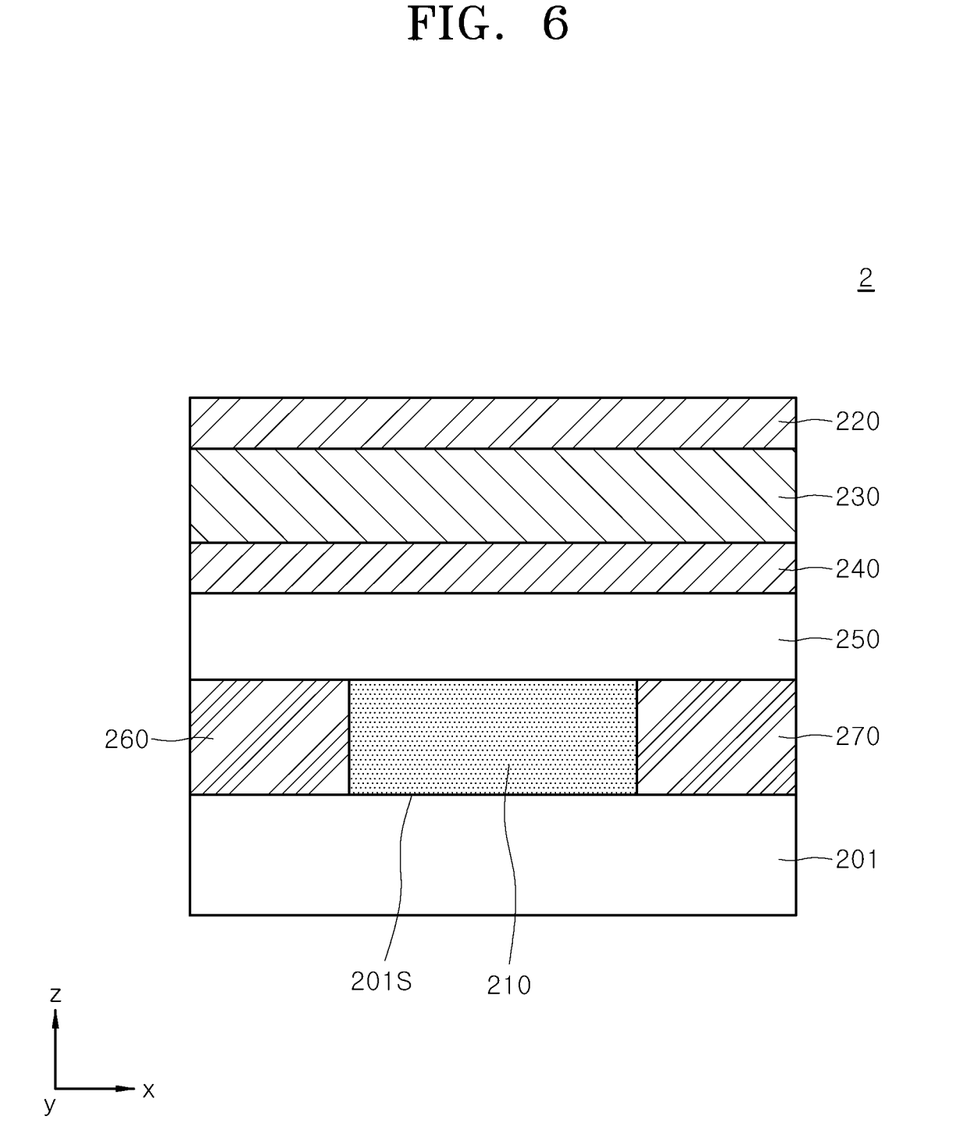
FIG. 6 is a cross-sectional view schematically illustrating a semiconductor device according to another embodiment of the present disclosure.

FIG. 6 is a cross-sectional view schematically illustrating a semiconductor device according to another embodiment of the present disclosure. Referring to FIG. 6, a semiconductor device 2 may include a substrate 201, and a source electrode layer 260 and a drain electrode layer 270, a threshold switching layer 250, a channel electrode layer 240, a gate dielectric layer 230, and a gate electrode layer 220, which are sequentially disposed on the substrate 201. Compared to a semiconductor device 1 of FIG. 1, the stacking order of the components may be reversed in the semiconductor device 2.

The substrate 201 may have substantially the same configuration as the substrate 101 of the semiconductor device 1 of FIG. 1. The source electrode layer 260 and the drain electrode layer 270 may be disposed on a surface 201S of the substrate 201 and may be spaced apart from each other in the x-direction. The material and electrical properties of each of the source electrode layer 260 and the drain electrode layer 270 may be substantially the same as the material and electrical properties of each of the source electrode layer 160 and the drain electrode layer 170 of the semiconductor device 1, which is described above with reference to FIG. 1.

A separating insulation layer 210 may be disposed between the source electrode layer 260 and the drain electrode layer 270. The separating insulation layer 210 may include an insulating material. The insulating material may include, for example, oxide, nitride, oxynitride, or a combination of two or more thereof.

The threshold switching layer 250 may be disposed on the source electrode layer 260, the drain electrode layer 270, and the separating insulation layer 210. The material and electrical properties of the threshold switching layer 250 may be substantially the same as the material and electrical properties of the threshold switching layer 150 of the semiconductor device 1 described with reference to FIG. 1.

The channel electrode layer 240 may be disposed on the threshold switching layer 250. The channel electrode layer 240 may be electrically separated from the source electrode layer 260 and the drain electrode layer 270. The material and electrical properties of the channel electrode layer 240 may be substantially the same as the material and electrical properties of the channel electrode layer 140 of the semiconductor device 1 described with reference to FIG. 1.

In an embodiment, at least a portion of the channel electrode layer 240 may overlap with at least a portion of the source electrode layer 260 in a direction (i.e., z-direction) substantially perpendicular to the surface 201S of the substrate 201. In addition, at least a portion of the channel electrode layer 240 may overlap with at least a portion of the drain electrode layer 270 in the z-direction.

The gate dielectric layer 230 may be disposed on the channel electrode layer 240. The material and electrical properties of the gate dielectric layer 230 may be substantially the same as the material and electrical properties of the gate dielectric layer 130 of the semiconductor device 1 described with reference to FIG. 1.

The gate electrode layer 220 may be disposed on the gate dielectric layer 230. The gate electrode layer 220 may be electrically separated from the channel electrode layer 240. The material and electrical properties of the gate electrode layer 220 may be substantially the same as the material and electrical properties of the gate electrode layer 120 of the semiconductor device 1 described with reference to FIG. 1.

Figure 7:
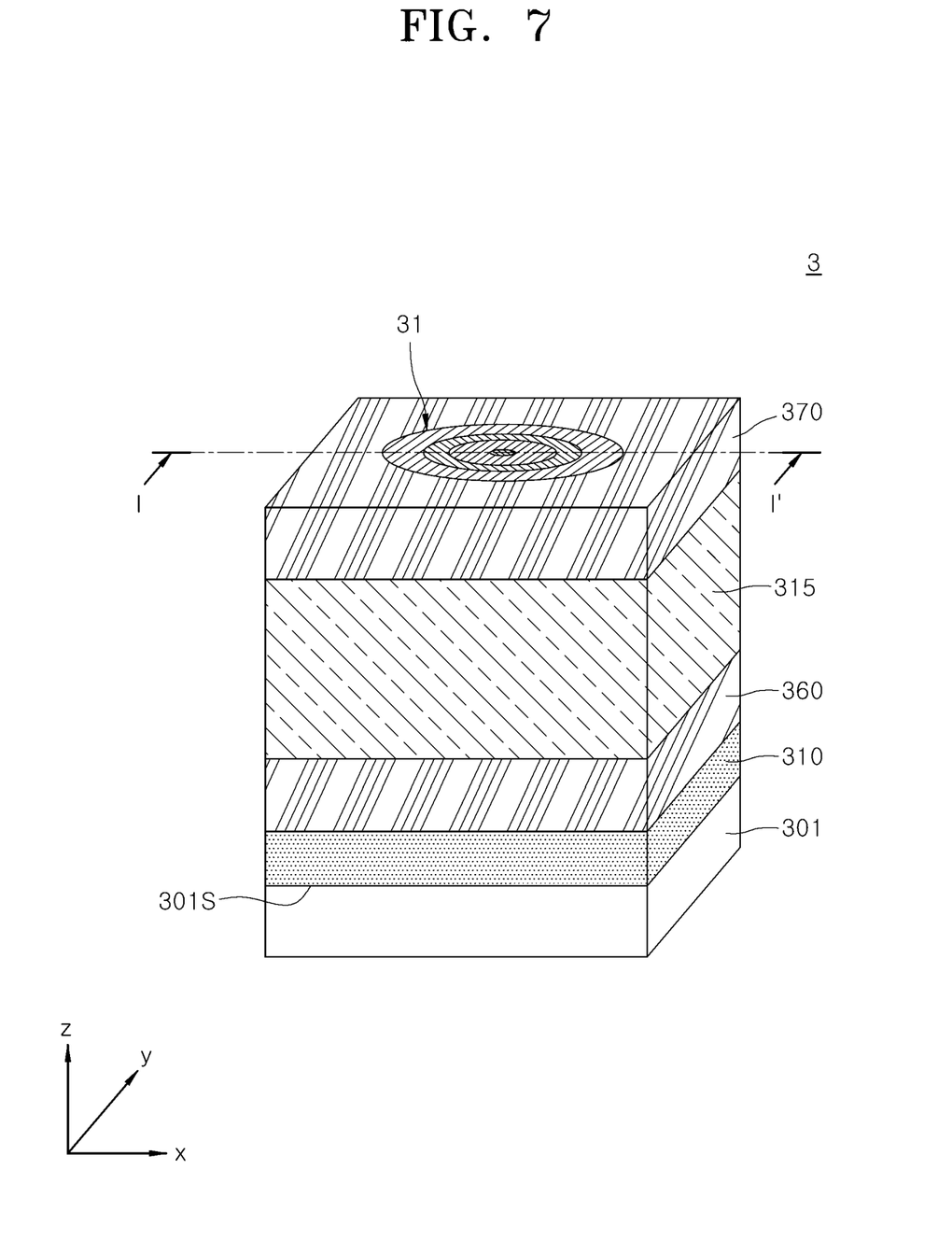
FIG. 7 is a perspective view schematically illustrating a semiconductor device according to a further embodiment of the present disclosure.
Figure 8:
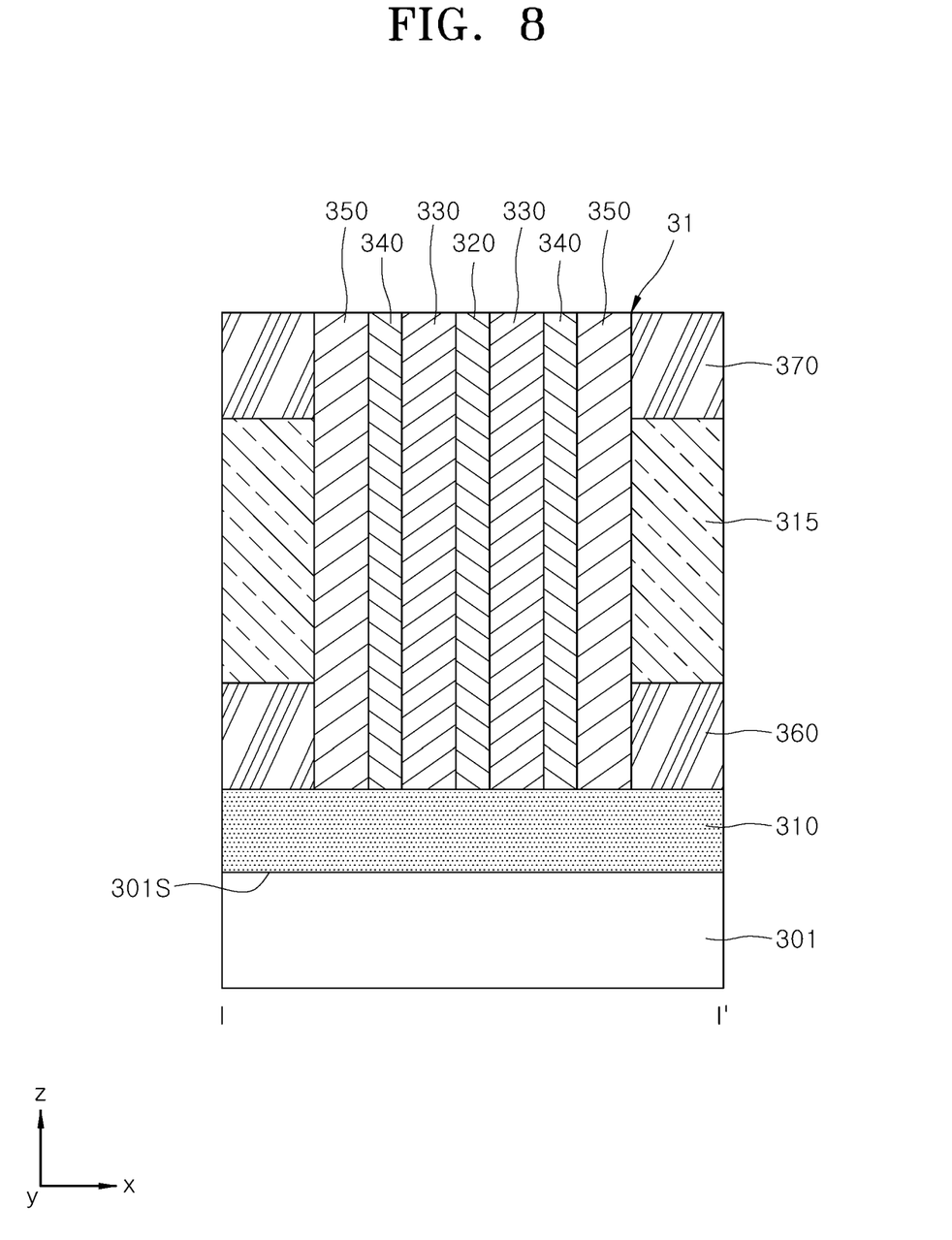
FIG. 8 is a cross-sectional view taken along line I-I' of the semiconductor device of FIG. 7.

FIG. 7 is a perspective view schematically illustrating a semiconductor device according to a further embodiment of the present disclosure. FIG. 8 is a cross-sectional view taken along line I-I' of the semiconductor device of FIG. 7. Referring to FIGS. 7 and 8, a semiconductor device 3 may include a substrate 301, a source electrode layer 360 and a drain electrode layer 370 that are disposed over the substrate 301 to be spaced apart from each other in a direction (i.e., z-direction) substantially perpendicular to a surface 301S of the substrate 301. In addition, the semiconductor device 3 may include a threshold switching layer 350 disposed to be in contact with the source electrode layer 360 and the drain electrode layer 370, a channel electrode layer 340 disposed to be in contact with the threshold switching layer 350, a gate dielectric layer 330 disposed on a sidewall surface of the channel electrode layer 340, and a gate electrode layer 320 disposed on a sidewall surface of the gate dielectric layer 330. The channel electrode layer 340 may extend in the z-direction.

Referring to FIGS. 7 and 8, the substrate 301 may include a material capable of being processed through semiconductor integration processes. As an example, the substrate 301 may include a semiconductor material or an insulating material. A base insulation layer 310 may be disposed on the substrate 301. The base insulation layer 310 may suppress the gate electrode layer 320, the channel electrode layer 340, and the source electrode layer 360 from being electrically connected to each other via the substrate 301.

The source electrode layer 360, an interlayer insulation layer 315, and the drain electrode layer 370 may be sequentially stacked on the base insulation layer 310. Each of the source electrode layer 360 and the drain electrode layer 370 may include a conductive material. The conductive material may include, for example, n-type or p-type doped silicon (Si), platinum (Pt), gold (Au), palladium (Pd), molybdenum (Mo), nickel (Ni), tungsten (W), titanium (Ti), copper (Cu), aluminum (Al), ruthenium (Ru), iridium (Ir), iridium oxide, tungsten nitride, titanium nitride, tantalum nitride, tungsten carbide, titanium carbide, tungsten silicide, titanium silicide, tantalum silicide, ruthenium oxide, or a combination of two or more thereof. The interlayer insulation layer 315 may include an insulating material. The insulating material may include, for example, oxide, nitride, oxynitride, or a combination of two or more thereof.

Referring to FIGS. 7 and 8, a hole pattern 31 may be formed on the base insulation layer 310 to penetrate the source electrode layer 360, the interlayer insulation layer 315, and the drain electrode layer 370. The threshold switching layer 350 may be disposed on sidewall surfaces of the source electrode layer 360, the interlayer insulation layer 315, and the drain electrode layer 370 exposed by the hole pattern 31. The threshold switching layer 350 may be disposed to be in direct contact with the source electrode layer 360 and the drain electrode layer 370. The threshold switching layer 350 may extend in the direction (i.e., z-direction) substantially perpendicular to the surface 301S of the substrate 301. The material and electrical properties of the threshold switching layer 350 may be substantially the same as the material and electrical properties of the threshold switching layer 150 of the semiconductor device 1 described with reference to FIG. 1.

The channel electrode layer 340 may be disposed on a sidewall surface of the threshold switching layer 350. The channel electrode layer 340 may be electrically separated from the source electrode layer 360 and the drain electrode layer 370. The channel electrode layer 340 may extend in the z-direction. The material and electrical properties of the channel electrode layer 340 may be substantially the same as the material and electrical properties of the channel electrode layer 140 of the semiconductor device 1 described with reference to FIG. 1.

The gate dielectric layer 330 may be disposed on the sidewall surface of the channel electrode layer 340. The gate dielectric layer 330 may extend in the z-direction. The material and electrical properties of the gate dielectric layer 330 may be substantially the same as the material and electrical properties of the gate dielectric layer 130 of the semiconductor device 1 described with reference to FIG. 1.

The gate electrode layer 320 may be disposed on the sidewall surface of the gate dielectric layer 330. The gate electrode layer 320 may be electrically separated from the channel electrode layer 340. The material and electrical properties of the gate electrode layer 320 may be substantially the same as the material and electrical properties of the gate electrode layer 120 of the semiconductor device 1 described with reference to FIG. 1.

As described above, a semiconductor device according to the embodiment may include the channel electrode layer, the threshold switching layer, the gate dielectric layer, and the gate electrode layer that extend in the direction substantially perpendicular to the surface of the substrate. In addition, the semiconductor device may include the source electrode layer and the drain electrode layer disposed to be spaced apart from each other in the direction substantially perpendicular to the surface of the substrate. Accordingly, the semiconductor device may provide a switching device having a three-dimensional structure.

Figure 9:
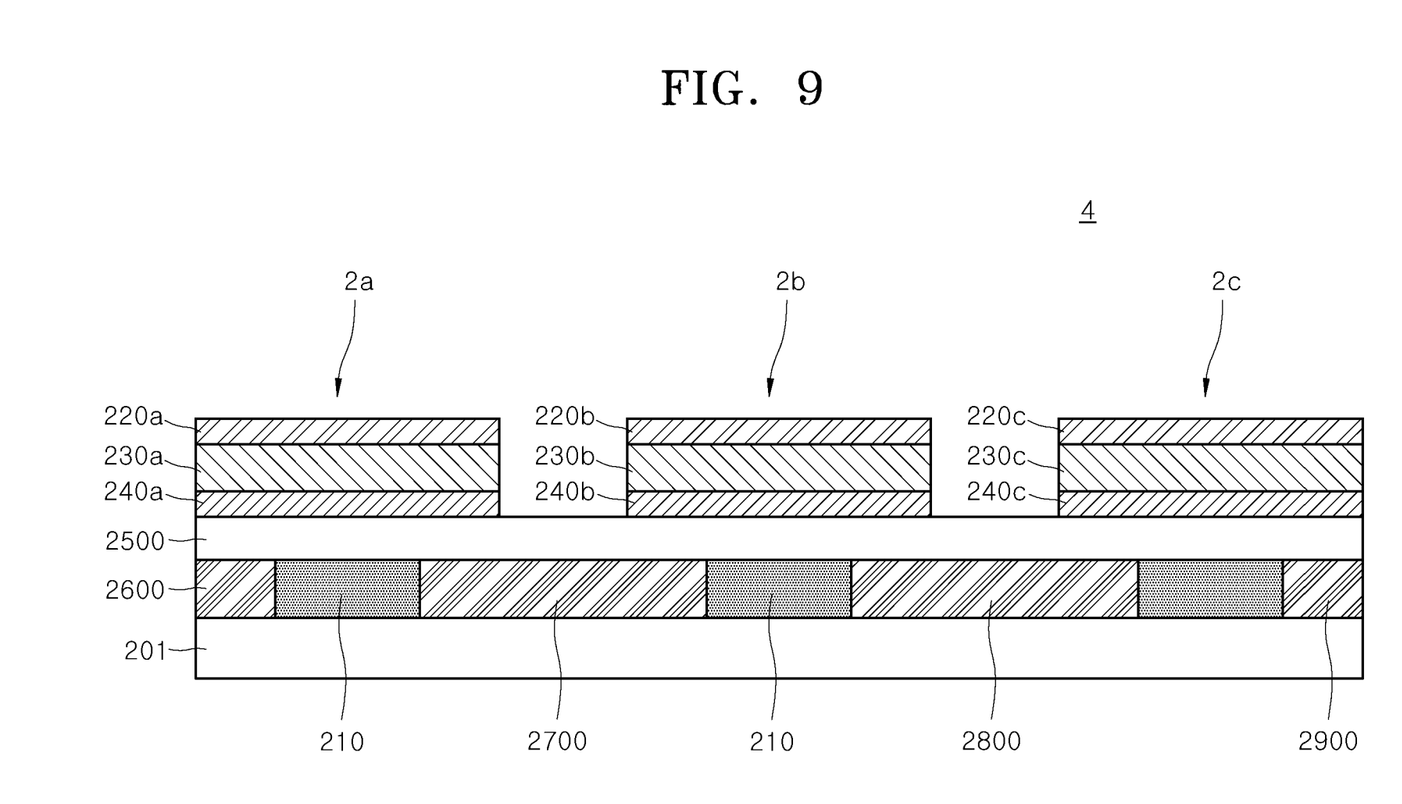
FIG. 9 is a cross-sectional view schematically illustrating an array of semiconductor devices according to yet another embodiment of the present disclosure.

FIG. 9 is a cross-sectional view schematically illustrating an array of semiconductor devices according to yet another embodiment of the present disclosure. Referring to FIG. 9, an array 4 of semiconductor devices 2a, 2b and 2c may include semiconductor devices 2, described above with reference to FIG. 2, that are connected in series.

Referring to FIG. 9, the array 4 of semiconductor devices 2a, 2b and 2c may include first to third semiconductor devices 2a, 2b, and 2c, which are connected in series to each other. The first semiconductor device 2a may include a first base electrode layer 2600 and a second base electrode layer 2700 disposed on a substrate 201 to be spaced apart from each other in a direction, such as for example an x-direction. The first base electrode layer 2600 and the second base electrode layer 2700 may function as a source electrode layer and a drain electrode layer of the first semiconductor device 2a, respectively. In addition, the first semiconductor device 2a may include a threshold switching layer 2500, a first channel electrode layer 240a, a first gate dielectric layer 230a, and a first gate electrode layer 220a, which are sequentially disposed on the first base electrode layer 2600 and the second base electrode layer 2700.

The second semiconductor device 2b may include the second base electrode layer 2700 and a third base electrode layer 2800 disposed on the substrate 201 to be spaced apart from each other in the same direction, such as for example the x-direction. The second base electrode layer 2700 and the third base electrode layer 2800 may function as a source electro layer and a drain electrode layer of the second semiconductor device 2b, respectively. In addition, the second semiconductor device 2b may include the threshold switching layer 2500, a second channel electrode layer 240b, a second gate dielectric layer 230b, and a second gate electrode layer 220b, which are sequentially disposed on the second base electrode layer 2700 and the third base electrode layer 2800.

The third semiconductor device 2c may include the third base electrode layer 2800 and a fourth base electrode layer 2900 disposed on the substrate 201 to be spaced apart from each other in the same direction, such as for example the x-direction. The third base electrode layer 2800 and the fourth base electrode layer 2900 may function as a source electro layer and a drain electrode layer of the third semiconductor device 2c, respectively. In addition, the third semiconductor device 2c may include the threshold switching layer 2500, a third channel electrode layer 240c, a third gate dielectric layer 230c, and a third gate electrode layer 220c, which are sequentially disposed on the third base electrode layer 2800 and the fourth base electrode layer 2900.

The first to third semiconductor devices 2a, 2b, and 2c may share the threshold switching layer 2500 with each other. In addition, a separating insulation layer 210 may be disposed on the substrate 201 to insulate the first base electrode layer 2600 from the second base electrode layer 2700, to insulate the second base electrode layer 2700 from the third base electrode layer 2800, and to insulate the third base electrode layer 2800 from the fourth base electrode layer 2900.

Referring to FIG. 9, the first semiconductor device 2a may be turned-on or turned-off by controlling the voltages applied to the first gate electrode layer 220a, the first base electrode layer 2600, and the second base electrode layer 2700. The second semiconductor device 2b may be turned-on or turned-off by controlling the voltages applied to the second gate electrode layer 220b, the second base electrode layer 2700, and the third base electrode layer 2800. The third semiconductor device 2c may be turned-on or turned-off by controlling the voltages applied to the third gate electrode layer 220c, the third base electrode layer 2800, and the fourth base electrode layer 2900.

In the array 4 of the semiconductor devices 2a, 2b and 2c, at least two or more of the first to third semiconductor devices 2a, 2b, and 2c may be simultaneously turned-on. Alternatively, at least two or more of the first to third semiconductor devices 2a, 2b, and 2c may be sequentially turned-on. The array 4 of the semiconductor devices 2a, 2b and 2c may constitute one operation unit to configure an array of switching elements.

Embodiments of the present disclosure have been disclosed for illustrative purposes. Those skilled in the art will appreciate that various modifications, additions and substitutions are possible, without departing from the scope and spirit of the present disclosure and the accompanying claims.

What is claimed is:

1. A semiconductor device comprising:
   a substrate;
   a gate electrode layer disposed over the substrate;
   a gate dielectric layer disposed on the gate electrode layer;
   a channel electrode layer disposed on the gate dielectric layer;
   a threshold switching layer disposed on the channel electrode layer; and
   a source electrode layer and a drain electrode layer that are disposed on the threshold switching layer to be spaced apart from each other,
   wherein the threshold switching layer includes a resistance change material having a non-memory property.

2. The semiconductor device of claim 1, wherein the channel electrode layer includes a conductor.

3. The semiconductor device of claim 1, wherein the channel electrode layer includes a noble metal.

4. The semiconductor device of claim 1, wherein the resistance change material includes at least one selected from the group consisting of silicon oxide, aluminum oxide, zirconium oxide, hafnium oxide, tungsten oxide, titanium oxide, nickel oxide, copper oxide, manganese oxide, tantalum oxide, niobium oxide, and iron oxide.

5. The semiconductor device of claim 1, wherein the resistance change material includes, as a dopant, at least one selected from the group consisting of silver (Ag), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

6. The semiconductor device of claim 1,
   wherein at least a portion of the source electrode layer and at least a portion of the channel electrode layer overlap with each other in a direction substantially perpendicular to a surface of the channel electrode layer, and
   wherein at least a portion of the drain electrode layer and at least a portion of the channel electrode layer overlap with each other in the direction substantially perpendicular to the surface of the channel electrode layer.

7. The semiconductor device of claim 1, further comprising a first conductive path formed between the source electrode layer and the channel electrode layer and a second conductive path formed between the drain electrode layer and the channel electrode layer according to a voltage applied to the gate electrode layer, wherein the semiconductor device is turned-on by a formation of the first conductive path and the second conductive path.

8. The semiconductor device of claim 1, further comprising first and second conductive filaments generated in the threshold switching layer according to a voltage applied to the gate electrode layer, wherein the first conductive filament electrically connects the source electrode layer and the channel electrode layer to each other, and the second conductive filament electrically connects the drain electrode layer and the channel electrode layer to each other.

9. The semiconductor device of claim 8, wherein conductive carriers conduct between the source electrode layer and the drain electrode layer through the first and second conductive filaments and the channel electrode layer.

10. The semiconductor device of claim 8, wherein the semiconductor device is turned on by generation of the first and second conductive filaments and is turned off through disconnection of the first and second conductive filaments.

11. A semiconductor device comprising:
a substrate;
a channel electrode layer disposed over the substrate;
a threshold switching layer disposed on a first surface of the channel electrode layer;
a source electrode layer and a drain electrode layer that are disposed on the threshold switching layer to be spaced apart from each other;
a gate dielectric layer disposed on a second surface of the channel electrode layer opposite to the first surface of the channel electrode layer; and
a gate electrode layer disposed on the gate dielectric layer,
wherein the threshold switching layer includes a resistance change material having a non-memory property.

12. The semiconductor device of claim 11, wherein the channel electrode layer includes a conductor.

13. The semiconductor device of claim 11, wherein the channel electrode layer includes a noble metal.

14. The semiconductor device of claim 11, wherein the resistance change material includes at least one selected from the group consisting of silicon oxide, aluminum oxide, zirconium oxide, hafnium oxide, tungsten oxide, titanium oxide, nickel oxide, copper oxide, manganese oxide, tantalum oxide, niobium oxide, and iron oxide.

15. The semiconductor device of claim 11, wherein the resistance change material includes, as a dopant, at least one selected from the group consisting of silver (Ag), aluminum (Al), lanthanum (La), niobium (Nb), vanadium (V), tantalum (Ta), tungsten (W), chromium (Cr), molybdenum (Mo), titanium (Ti), copper (Cu), zirconium (Zr), and hafnium (Hf).

16. The semiconductor device of claim 11,
wherein at least a portion of the source electrode layer and at least a portion of the channel electrode layer overlap with each other in a direction substantially perpendicular to the first surface of the channel electrode layer, and
wherein at least a portion of the drain electrode layer and at least a portion of the channel electrode layer overlap with each other in the direction substantially perpendicular to the first surface of the channel electrode layer.

17. A semiconductor device comprising:
a substrate;
a source electrode layer and a drain electrode layer that are disposed over the substrate to be spaced apart from each other in a direction perpendicular to a surface of the substrate;
a threshold switching layer disposed over the substrate to contact the source electrode layer and the drain electrode layer;
a channel electrode layer disposed over the substrate to contact the threshold switching layer;
a gate dielectric layer disposed on the channel electrode layer; and
a gate electrode layer disposed on the gate dielectric layer,
wherein the threshold switching layer includes a resistance change material having a non-memory property.

18. The semiconductor device of claim 17, wherein the channel electrode layer extends in the direction perpendicular to the surface of the substrate.

19. The semiconductor device of claim 17, wherein the channel electrode layer includes a conductor.

20. The semiconductor device of claim 17, wherein the channel electrode layer includes a noble metal.

* * * * *